United States Patent [19]
Gardner et al.

[11] Patent Number: 6,040,220
[45] Date of Patent: Mar. 21, 2000

[54] ASYMMETRICAL TRANSISTOR FORMED FROM A GATE CONDUCTOR OF UNEQUAL THICKNESS

[75] Inventors: Mark I. Gardner, Cedar Creek; Daniel Kadosh; Michael P. Duane, both of Austin, all of Tex.

[73] Assignee: Advanced Micro Devices, Inc., Sunnyvale, Calif.

[21] Appl. No.: 08/950,203

[22] Filed: Oct. 14, 1997

[51] Int. Cl.[7] .................................................. H01L 21/00
[52] U.S. Cl. ............................................ 438/286; 438/307
[58] Field of Search .................................. 438/286, 307, 438/585, 305, 303

[56] References Cited

U.S. PATENT DOCUMENTS

| | | |
|---|---|---|
| 4,663,827 | 5/1987 | Nakahara . |
| 4,818,715 | 4/1989 | Chao . |
| 5,654,218 | 8/1997 | Lee . |
| 5,866,448 | 2/1999 | Pradeep et al. .......................... 438/231 |
| 5,880,015 | 3/1999 | Hata ......................................... 438/585 |

*Primary Examiner*—Richard Booth
*Attorney, Agent, or Firm*—Kevin L. Daffer; Conley, Rose & Tayon

[57] ABSTRACT

An asymmetrical transistor, and a gate conductor used in forming that transistor, are provided. The gate conductor is formed by removing upper portions of the gate conductor along an elongated axis which the gate conductor extends. The removed portions presents a partially retained region of lesser thickness than the fully retained region immediately adjacent thereto. An implant is then forwarded to the substrate adjacent and partially below the gate conductor. Only the partially retained portions allow a subset of the originally forwarded ions to pass into the substrate to form a lightly doped drain (LDD) between the channel and the drain. The partially retained region occurs only near the drain and not adjacent the source so that the LDD area is self-aligned between the edge of the conductor and a line of demarcation separating the fully retained portion and the partially retained portion. There may be numerous lines of demarcation and corresponding numerous thicknesses across the gate conductor length to provide a graded LDD area if desired.

12 Claims, 3 Drawing Sheets

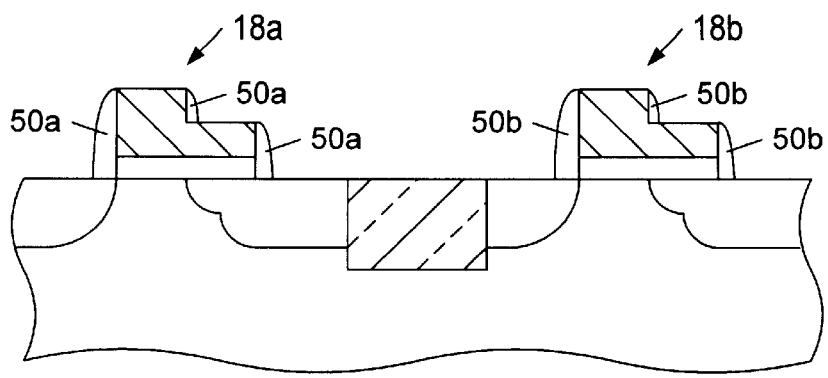
FIG. 7
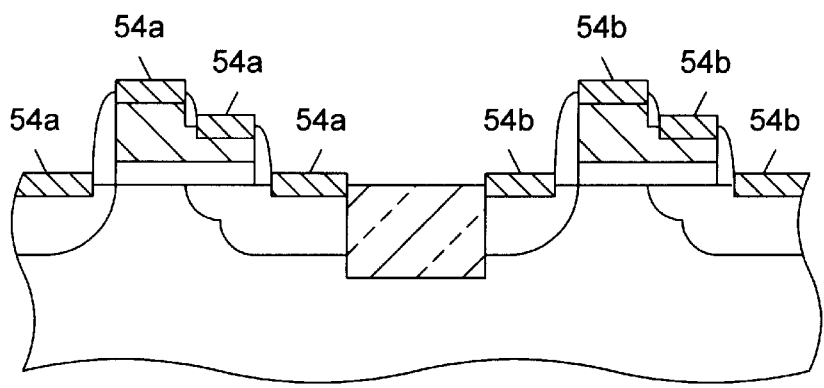
FIG. 8
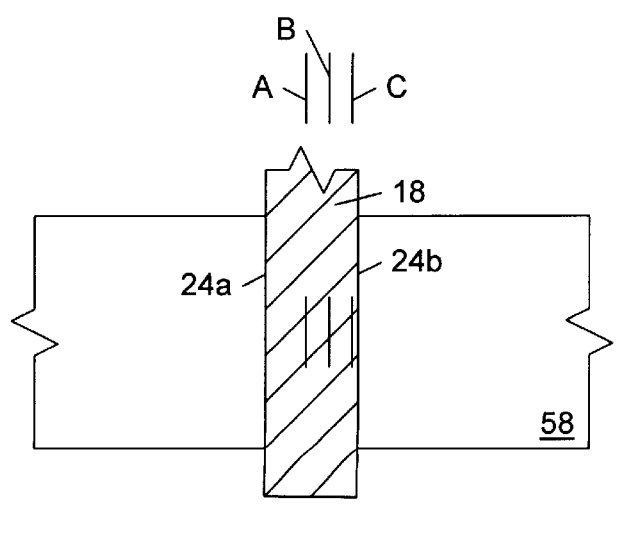
FIG. 9

ASYMMETRICAL TRANSISTOR FORMED FROM A GATE CONDUCTOR OF UNEQUAL THICKNESS

BACKGROUND OF THE INVENTION

1. Field of the Invention

This invention relates to semiconductor fabrication and, more particularly, to forming a transistor gate conductor of non-uniform thickness to provide a partial mask to active area implants, resulting in an asymmetrical transistor having lightly doped drain ("LDD") region bounded within the substrate beneath relatively thin areas of the gate conductor.

2. Description of Related Art

Fabrication of a MOSFET device is well known. Generally speaking, MOSFETs are manufactured by placing an undoped polycrystalline ("polysilicon") material over a relatively thin gate oxide. The polysilicon material and gate oxide is then patterned to form a gate conductor with source/drain regions adjacent to and on opposite sides of the gate conductor. The gate conductor and source/drain regions are then implanted with an impurity dopant material. If the impurity dopant material used for forming the source/drain regions is n-type, then the resulting MOSFET is an NMOSFET ("n-channel") transistor device. Conversely, if the source/drain dopant material is p-type, then the resulting MOSFET is a PMOSFET ("p-channel") transistor device.

The gate conductor and adjacent source/drain regions are generally formed using well known photolithography techniques. Gate conductors and source/drain regions are generally limited to openings formed through a thick layer of what is commonly referred to as field oxide. Those openings and the transistors formed therein are termed active regions. The field oxide generally occurs in inactive regions formed either from local oxidation of silicon ("LOCOS") or by a shallow trench isolation ("STI") process. The active regions are therefore regions between field oxide regions. Metal interconnect is routed over the field oxide to couple with select polysilicon gate conductors as well as with the source/drain regions to complete the overall circuit structure.

Integrated circuits utilize either n-channel devices exclusively, p-channel devices exclusively, or a combination of both on a unitary monolithic substrate. While both types of devices can be formed, the devices are distinguishable based on the source/drain impurity dopant. The method by which n-type dopant is used to form an n-channel device and p-type dopant is used to form a p-channel device entails unique problems associated with each device. As layout densities increase, the problems are exacerbated. Device failure can occur unless adjustments are made to processing parameters and processing steps. N-channel processing must, in most instances, be dissimilar from p-channel processing due to the unique problems of each type of device.

N-channel devices are particularly sensitive to so-called short-channel effects ("SCE"). The distance between source and drain regions is often referred to as the physical channel length. However, after implantation and subsequent diffusion of the source and drains, distance between the source and drains regions become less than the physical channel length and is often referred to as the effective channel length ("Leff"). In VLSI designs, as the physical channel becomes small, so too must the Leff. SCE becomes a predominant problem whenever Leff drops below approximately 2.0 μm.

Generally speaking, SCE impacts device operation by, inter alia, reducing device threshold voltages and increasing sub-threshold currents. As Leff becomes quite small, the depletion regions associated with the source and drain areas may extend toward one another and substantially occupy the channel area. Hence, some of the channel will be partially depleted without any influence of gate voltage. As a result, less gate charge is required to invert the channel of a transistor having a short Leff. Somewhat related to threshold voltage lowering is the concept of sub-threshold current flow. Even at times when the gate voltage is below the threshold amount, current between the source and drain nonetheless exist for transistors having a relatively short Leff.

Two of the primary causes of increased sub-threshold current are: (i) punch through and (ii) drain-induced barrier lowering ("DIBL"). Punch through results from the widening of the drain depletion region when a reverse-bias voltage is applied across the drain-well diode. The electric field of the drain may eventually penetrate to the source area, thereby reducing the potential energy barrier of the source-to-body junction. Punch through current is therefore associated within the substrate bulk material, well below the substrate surface. Contrary to punch through current, DIBL-induced current occurs mostly at the substrate surface. Application of a drain voltage can cause the surface potential to be lowered, resulting in a lowered potential energy barrier at the surface and causing the sub-threshold current in the channel near the silicon—silicon dioxide interface to be increased. One method in which to control SCE is to increase the dopant concentration within the body of the device. Unfortunately, increasing dopant within the body deleteriously increases potential gradients in the ensuing device.

Increasing the potential gradients produces an additional effect known as hot-carrier injection ("HCI"). HCI is a phenomena by which the kinetic energy of the carriers (holes or electrons) is increased as they are accelerated through large potential gradients and subsequently become trapped within the gate oxide. The greatest potential gradient, often referred to as the maximum electric field ("Em") occurs near the drain during saturated operation. More specifically, the electric field is predominant at the lateral junction of the drain adjacent the channel.

Using the n-channel example, the electric field at the drain causes channel electrons to gain kinetic energy. Electron-electron scattering randomizes the kinetic energy and the electrons become "hot". Some of these hot electrons have enough energy to create electron-hole pairs through impact ionization of the silicon atoms. Electrons generated by impact ionization join the flow of channel electrons, while the holes flow into the bulk to produce a substrate current in the device. The substrate current is the first indication of the creation of hot carriers in a device. For p-channel devices, the fundamentals of the process are essentially the same except that the role of holes and electrons are reversed.

HCI occurs when some of the hot carriers are injected into the gate oxide near the drain junction, where they induce damage and become trapped. Traps within the gate oxide generally become electron traps, even if they are initially filled with holes. As a result, there is a negative charge density in the gate oxide. The trapped charge accumulates with time, resulting in positive threshold shifts in both n-channel and p-channel devices. It is known that since hot electrons are more mobile than hot holes, HCI causes a greater threshold skew in n-channel devices than p-channel devices. Nonetheless, a p-channel device will undergo negative threshold skew if its Leff is less than, e.g., 0.8 μm.

Unless modifications are made to the transistor structure, problems of sub-threshold current and threshold shift resulting from SCE and HCI will remain. To overcome these problems, alternative drain structures such as double-diffused drains (DDDs) and lightly doped drains (LDDs) must be used. The purpose of both types of structures is the same: to absorb some of the potential into the drain and thus reduce Em. The popularity of DDD structures has given way to LDD structures since DDD causes unacceptably deep junctions and deleterious junction capacitance.

A conventional LDD structure is one whereby a light concentration of dopant is self-aligned to the gate conductor followed by a heavier dopant self-aligned to the gate conductor on which two sidewall spacers have been formed. The purpose of the first implant dose is to produce a lightly doped section of both the source and drain areas at the gate edge near the channel. The second implant dose is spaced from the channel a distance dictated by the thickness of the sidewall spacer. Resulting from the first and second implants, a dopant gradient occurs at the junction between the source and channel as well as the junction between the drain and channel.

A properly defined LDD structure therefore entails a pair of spacers formed on the opposed sidewall surfaces of the gate conductor. Additionally, LDD implant occurs separate and distinct from the source/drain implant, and is purposefully designed to forward a lower dosage of species nearer the channel on both the drain-side as well as the source-side. An LDD implant adjacent the channel unfortunately adds resistance to the source/drain path. This added resistance, generally known as parasitic resistance, can have many deleterious effects. First, parasitic resistance can decrease the saturation current (i.e., current above threshold). Second, parasitic resistance can decrease the drive strength and the overall speed of the transistor.

The problems involved in decreasing saturation current and transistor speed is best explained in reference to a transistor having a source resistance and a drain resistance. Those resistances are partially compounded by the additional resistance provided by an LDD structure adjacent both the source and the drain. Using a n-channel example, the drain resistance $R_D$ causes the gate edge near the drain to "see" a voltage less than VDD, to which the drain is typically connected. Similarly, the source resistance $R_S$ causes the gate edge near the source to see some voltage more than ground. As far as the transistor is concerned, its drive current along the source-drain path depends mostly on the voltage applied between the gate and source, i.e., $V_{GS}$. If $V_{GS}$ exceeds the threshold amount, the transistor will go into saturation according to the following relation:

$$I_{DSAT} = K/2(V_{GS}-V_T)^2,$$

where $I_{DSAT}$ is saturation current, K is a value derived as a function of the process parameters used in producing the transistor, and $V_T$ is the threshold voltage. Reducing or eliminating $R_S$ would therefore draw the source voltage closer to ground, and thereby increase the effective $V_{GS}$. From the above equation, it can be seen that increasing $V_{GS}$ directly increases $I_{DSAT}$. While it would seem beneficial to decrease $R_D$ as well, $R_D$ is nonetheless needed to maintain HCI control. Accordingly, substantial LDD is required in the drain area. It would therefore seem beneficial to decrease $R_S$ rather than $R_D$. This implies the need for a process to decrease $R_S$ (source-side LDD area) while maintaining $R_D$ (drain-side LDD area).

Proper LDD design must take into account the need for minimizing parasitic resistance $R_S$ at the source side while at the same time attenuating Em at the drain-side of the channel. Further, proper LDD design requires that the injection position associated with the maximum electric field Em be located under the gate conductor edge, preferably well below the silicon surface. It is therefore desirable to derive an LDD design which can achieve the aforesaid benefits while still properly placing and diffusing Em. This mandates that the channel-side lateral edge of the LDD area be well below the edge of the gate. Regardless of the LDD structure chosen, the ensuing transistor must be one which is not prone to excessive sub-threshold currents, even when the Leff is less than, e.g., 2.0 μm.

The desired LDD-embodied transistor which overcomes the above problems must be applicable to either an n-channel transistor or a p-channel transistor. That transistor must be one which can be readily fabricated within existing process technologies. In accordance with many modern fabrication techniques, it would be desirable that the improved transistor be formed having an impurity concentration or net impurity concentration within the gate conductor of the same type as the LDD implant area and the source/drain area.

SUMMARY OF THE INVENTION

The problems outlined above are in large part solved by an improved transistor configuration. The transistor can be either a p-channel or an n-channel transistor, and is herein classified as an asymmetrical transistor, where the source-side has virtually no LDD implant. However, the drain-side does receive an LDD implant.

According to a preferred embodiment, the LDD implant is induced into the drain-side, between the channel and the drain junctions, concurrent with implanting the source and drain regions. Thus, the source/drain implant and the LDD implant occurs in a single step using the same implant species, the same implant energies and the same dosage. Multiple steps involved in forming LDD regions aligned to the gate conductor sidewall surfaces, forming spacers upon those sidewall surfaces, and then forming source/drain regions aligned to the spacers is eliminated in favor of a more simple and less cumbersome process sequence hereof. Accordingly, the present process sequence can produce and asymmetrical transistor and all the advantages of the asymmetrical transistor with fewer steps to enhance the overall fabrication throughput.

The asymmetrical transistor is formed by first producing a gate conductor having at least two dissimilar thicknesses. Preferably, the gate conductor extends along an axis across the gate dielectric. A portion of the gate conductor is removed along that axis from one of the sidewall surfaces inward toward a mid-line between a pair of opposed sidewall surfaces. The mid-line may serve as a line of demarcation between a thick region of the gate conductor and thin region of the gate conductor. Alternatively, the line of demarcation may be between the mid-line and one of the sidewall surfaces. The overall result of forming a gate conductor having at least two separate and distinct thicknesses is to selectively mask the ensuing dopant directed at the gate conductor. Implant energies of those dopants is selected relevant to the gate conductor thicknesses so that the thicker portion of the gate conductor will substantially block all dopants from passing into the substrate directly below the thicker portion. However, the thinner portion will allow a select quantity of dopants to pass therethrough and into the substrate directly below the thinner portion. Preferably, the thicker portion is aligned directly above the channel region, and the thinner portion is aligned directly above an LDD area between the channel and the drain junction. By carefully designing the relative thickness of the thinner portion and the implant energies of the ion implant directed toward the gate conductor, implants only pass through the thinner portion to form the LDD only at the drain-side of the channel and not the source-side. This results in a high performance transistor with the LDD placed only in the regions where it is needed—i.e., at the drain-side and not at the source-side.

LDD implant focused almost exclusively at the drain-side ensures a sufficient LDD area to maintain parasitic resistance of the drain LDD (i.e., $R_D$) but substantially eliminates parasitic resistance $R_S$ associated with the source-side. Thus, the drain-engineered structure hereof serves to attenuate the maximum electric field Em in the critical drain area while reducing parasitic resistance $R_S$ in the source area. Shifting the electric field Em occurs only in the region where shifting is necessary, i.e., only in the drain-side of the channel.

Forming the LDD area and the channel area is dependent on the overall width of the gate conductor. By "thinning" a portion of the initial gate conductor using a photolithography step, the LDD area is dependent solely on that step, and not upon a combination of photolithography and deposition. In the conventional sense, the LDD area arises from the steps of defining a gate conductor sidewall surface, and then depositing a spacer on that surface. Both steps are susceptible to the process skews and/or misalignments which might result in an unacceptably large or small LDD area. By simply defining the LDD area from a pre-existing gate conductor and fixing that area relative to the channel, variability is reduced. Secondly, any variability in LDD area is inversely proportion to variability in the channel area. Thus, if the channel length is quite large, the LDD length will be correspondingly small. Conversely, if the channel length is small, then the LDD length will be large. This is a proper indirect apportionment since it is only when the channel is small will SEC problems occur and the need for a relatively large LDD necessary.

Broadly speaking, the present invention contemplates a method for forming a transistor. The method comprises forming a gate dielectric upon a semiconductor substrate, and then patterning a gate conductor upon the gate dielectric. The patterned gate conductor extends upon the gate dielectric along an axis between a pair of sidewall surfaces spaced parallel to the axis. An upper portion of the gate conductor can then be removed. According to one embodiment, that upper portion is bounded by one of the pair of sidewall surfaces and a mid-point between those sidewall surfaces. Thus, the removed portion extends from one of the sidewall surfaces toward the other of the sidewall surfaces along the axis defined by the gate conductor. A result of removing a portion of the gate conductor is the production of a partially retained area of the gate conductor and a fully retained area of the gate conductor. Ionized atoms (or dopants) are forwarded toward the gate conductor at an energy level which allows a portion of those atoms to extend through the partially retained area of the gate conductor and form an LDD region within a substrate directly beneath the partially retained area.

According to one embodiment, the gate conductor comprises a contiguous polycrystalline silicon structure having at least two thicknesses extending along the axis between a pair of opposed sidewall surfaces. The opposed sidewall surfaces are those which extend downward to the gate dielectric and are not defined as the sidewall surface formed by the line of demarcation.

The present invention further contemplates a transistor. The transistor comprises a contiguous gate conductor extending at least partially along an elongated axis laterally bounded between the pair of opposed sidewall surfaces and vertically bounded between a single lower elevation and a pair of dissimilar upper elevations. An implant is forwarded through only a portion of the gate conductor bounded between the single lower elevation and a lowermost elevation of the pair of dissimilar upper elevations. The line of demarcation is that which separates the pair of dissimilar upper elevations, possibly along a mid-point between the opposed sidewall surfaces or spaced a parallel, lateral distance from that mid-point depending on the desired size of the LDD length relative to the channel length.

BRIEF DESCRIPTION OF THE DRAWINGS

Other objects and advantages of the invention will become apparent upon reading the following detailed description and upon reference to the accompanying drawings in which:

FIG. 7 is a cross-sectional view of spacers formed on sidewall surfaces of the gate conductors in a processing step subsequent to FIG. 6;

FIG. 8 is a cross-sectional view of silicide formed upon and within the gate conductors void of the sidewall surfaces in a processing step subsequent to FIG. 7; and FIG. 9 is a top view of the gate conductor of dissimilar thickness formed according to one embodiment of the present invention.

Figure 1:
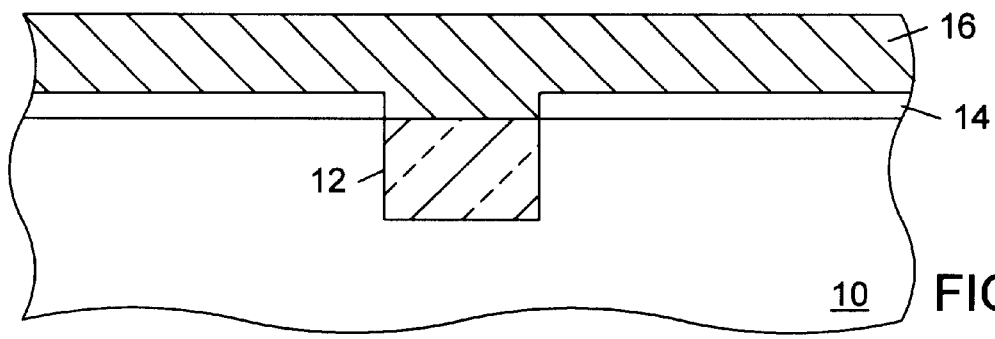
FIG. 1 is a partial cross-sectional view of a semiconductor substrate surface segregated with a field dielectric and a gate conductor material dielectrically spaced above active regions between the field dielectric.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents and alternatives falling within the spirit and scope of the present invention.

DETAILED DESCRIPTION OF PREFERRED EMBODIMENTS

Turning now to the drawings, FIG. 1 is a partial, cross-sectional view of a semiconductor substrate 10. Substrate 10 is preferably single crystalline silicon arranged in a somewhat uniform lattice structure. Formed within substrate 10 is an isolation region 12. Region 12 can be formed using the STI technique, whereby a trench is formed in substrate 10 followed by a fill dielectric placed within the trench. Preferably, the fill dielectric comprises an oxide derived from a silane or TEOS source. Alternatively, isolation region 12 can be formed from a LOCOS technique.

After region 12 is formed, a thermal oxide 14 is grown upon the upper surface of substrate 10. Oxide 14 is relatively thin, and is hereinafter referred to as the gate dielectric. Depending on the desired performance, gate dielectric 14 can be grown to thicknesses ranging between 50 and 500 angstroms, for example. Dielectric 14 is preferably grown from a lightly doped n-type or p-type silicon substrate 10 having a resistivity suitably in the range of 10 to 12 ohms-cm.

Figure 2:
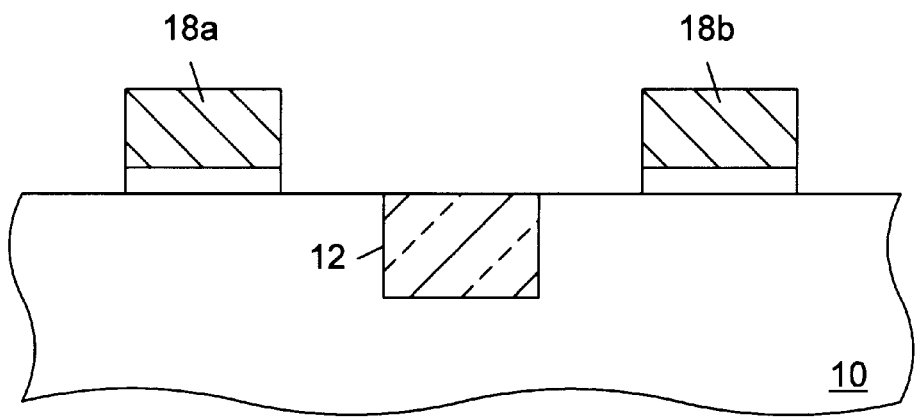
FIG. 2 is a partial cross-sectional view of the semiconductor substrate surface upon which patterned gate conductors are formed in a processing step subsequent to FIG. 1.

Following gate dielectric formation, a polycrystalline silicon material 16 is deposited. Polycrystalline silicon (or polysilicon) 16 is preferably deposited using well-known deposition techniques, such as chemical vapor deposition ("CVD"). Polysilicon 16 can thereafter be selectively patterned, as shown in FIG. 2. Specifically, polysilicon 16 is removed in areas not covered by a masking layer, a suitable masking layer being photoresist. The retained polysilicon material is denoted as reference numeral 18, and henceforth referred to as a gate conductor. Gate conductor 18 and underlying gate dielectric 14 exists in select regions between isolation structures 12, those regions defined as active regions.

Figure 3:
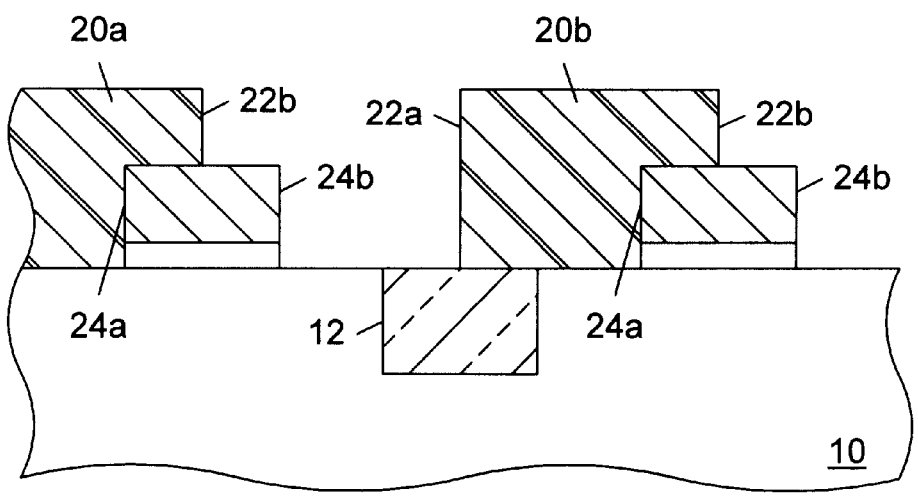
FIG. 3 is a cross-sectional view of the gate conductors partially covered by a masking material in a processing step subsequent to FIG. 2.

FIG. 3 illustrates a selectively formed masking layer 20. Preferably, masking layer 20 is patterned such that a sidewall surface 22 resides near a mid-line between opposing sidewall surfaces 24 of gate conductor 18. The other sidewall surface 22 of the patterned masking layer 20 may extend to somewhere above isolation structure 12. It is not necessary that sidewall surface 22a, shown in FIG. 3, extends perpendicular from substrate 10 surface directly from the mid-point of structure 12. All that is necessary is that sidewall surface 22a extend somewhat near a perpendicular line of orientation and somewhere over isolation structure 12, according to one embodiment.

Figure 4:
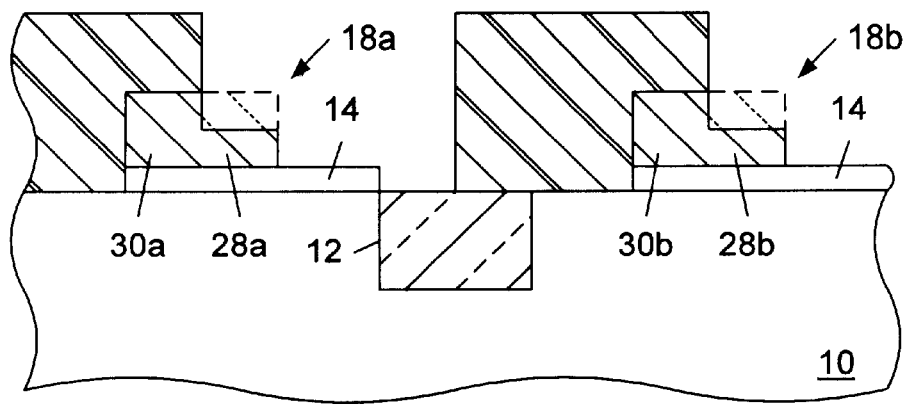
FIG. 4 is a cross-sectional view of the exposed portions of the gate conductors partially removed in a processing step subsequent to FIG. 3.

Sidewall surfaces 22b of each patterned masking layer 20 should extend along an axis defined as the elongated axis by which gate conductor 18 extends. The exposed regions of gate conductor 18 are removed, as shown in FIG. 4. Specifically, only the upper portions of exposed regions are removed, leaving a partially retained portion 28 and a fully retained portion 30 of the ensuing gate conductor 18. By design, the etchant used to remove portions of gate conductor 18 is highly selective to polysilicon, as opposed to thermally grown oxide or single crystalline silicon. Thus, FIG. 4 indicates an optional embodiment in which gate dielectric 14 is retained when gate conductor 18 is patterned. The retained gate dielectric 14 may contain nitrogen and may comprise nitrogenated oxide or oxynitride. The nitrogen-bearing oxide may provide an enhanced etch stop to ensure substrate 10 beneath gate dielectric 14 is not damaged as a result of the polysilicon etch. Gate dielectric 14 need not extend, and does not extend, into isolation structure 12. Any etching of the fill dielectric caused by the polysilicon etch will not be detrimental if the fill dielectric is sufficiently thick.

Figure 5:
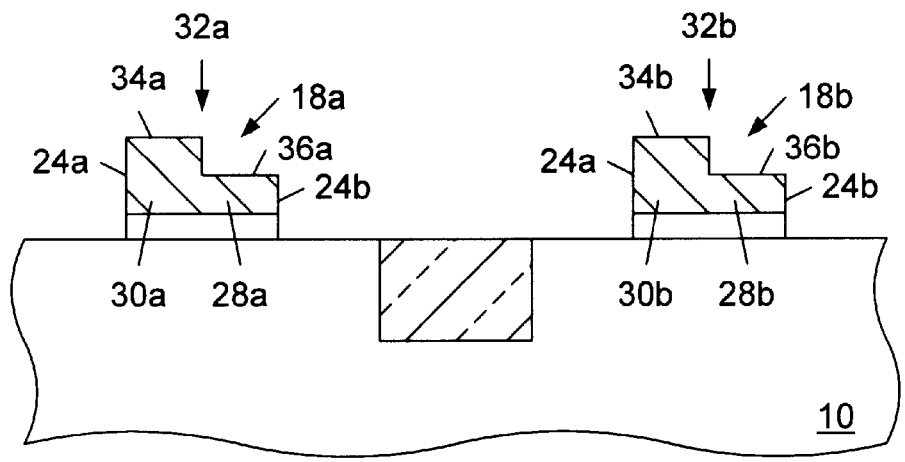
FIG. 5 is a cross-sectional view of the gate conductors formed as a result of the processing step of FIG. 3.

FIG. 5 indicates gate conductors 18 formed as a result of the partial, selected etching carried out in FIG. 4. Following removal of masking layer 20, gate conductor 18 comprises a line of demarcation 32 between two dissimilar thicknesses. A relatively thin thickness occurs as a result of the partially retained portion 28, and a thicker portion results from the fully retained portion. Gate conductor 18 is therefore presented as an L-shaped, contiguous conductor laterally bounded between a pair of sidewall surfaces 24, wherein one sidewall surface extends vertically upward from substrate 10 a lesser distance than the other sidewall surface. Further, gate conductor 18 is bounded between a single lower elevation and a pair of dissimilar upper elevations 34 and 36.

Figure 6:
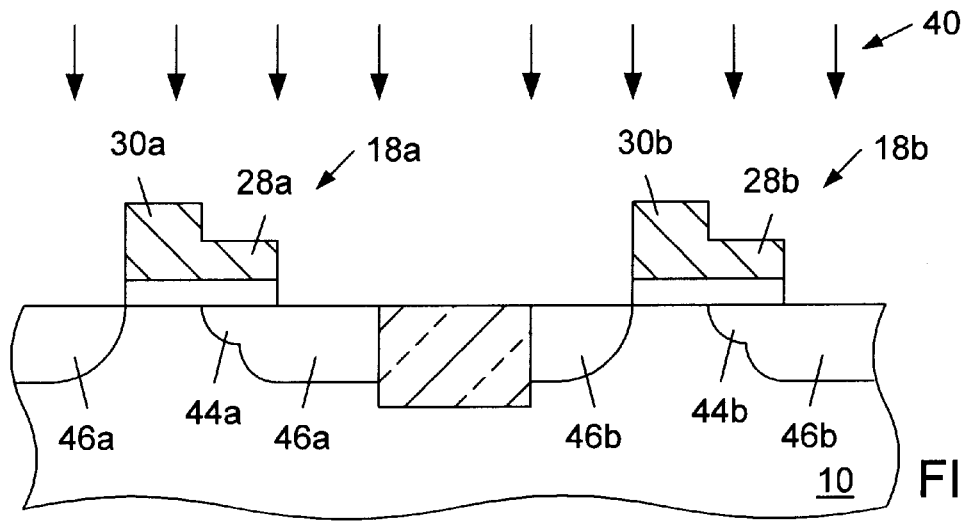
FIG. 6 is a cross-sectional view of the gate conductors used to entirely mask and partially mask an implant forwarded into the active regions to form LDD areas only in the drain areas in a processing step subsequent to FIG. 5.

FIG. 6 indicates an implant species 40 of pre-defined energy and dopant concentration forwarded into substrate 10. Energy is chosen such that fully retained portion 30 will block implants from passing therethrough. However, partially retained portion 28 allows a portion of the implant to pass. That portion is partially blocked or "retarded" from passing to its normal depth absent portion 28. Accordingly, portion 28 allows a smaller concentration of dopants placed at a shallower depth within substrate 10 directly below portion 28 as compared to the implant profile completely outside of portions 28 and 30. The resulting implant profile is shown comprising an LDD region 44 and a source/drain region 46.

Implant 40 can comprise sequential implants of n-type species followed by p-type species, or vice versa. Thus, a masking layer may be applied over the active region and gate conductor 18b, allowing n-type species to be placed into the substrate adjacent gate conductor 18a. Subsequently, p-type species can be implanted into the substrate 10 adjacent gate conductor 18b when gate conductor 18a and active regions adjacent thereto are masked. Accordingly, implant 40 can be designed so that both n-channel and p-channel transistors can be formed in a CMOS environment, if needed.

FIG. 7 indicates the formation of a spacer 50 upon sidewall surfaces of the gate conductor 18. Spacer 50 may be formed by blanket depositing an oxide upon the gate conductor 18 as well as across regions not covered by gate conductor 18. Thereafter, the blanket-deposited oxide can be cleared from the horizontal surfaces using an anisotropic etch. This leave oxide only adjacent sidewall surfaces (i.e., adjacent vertical surfaces) as shown.

Spacers 50 prevent "bridging" problems generally known in the industry whenever a self-aligned silicide ("salicide") layer is formed. FIG. 8 indicates a salicide 54 formed by depositing a layer of refractory metal, such as titanium, across the entire exposed surfaces as well as spacer 50 surface. Thereafter, the refractory metal is heated to a temperature sufficient to cause a silicon/metal reaction only in areas where silicon is present. Thus, silicide 54 occurs only in regions void of the oxide-based spacer 50. Silicide 54 provides better mechanical and electrical connectivity to a subsequent metallization layer selectively contacted to the upper surface of a respective silicide region. Forming the metallization layer subsequent to forming an interlevel dielectric is generally well known in the art.

FIG. 9 illustrates a top plan view of a gate conductor 18 formed across an active region 58. Active region 58 represents a gate dielectric-covered substrate void of an isolation structure and/or field oxide. One or more lines of demarcation 32 may exist. For example, the line of demarcation 32 may occur near a mid-line A between opposing sidewall surfaces 24 of gate conductor 18. Alternatively, the line of demarcation 32 can be shifted from point A to point B to present a smaller LDD area relative to the channel area subsequent to active area implantation. Similarly, there may be multiple lines of demarcation A, B, and C to provide a graded LDD. The area of gate conductor 18 between points A and B can be made thicker in cross-sectional dimension than the area between points B and C so that the LDD profile gradually increases in depth from the channel to the outer edge of gate conductor 18. A graded LDD profile more gradually distributes Em along a larger or longer lateral distance so that the voltage drop is shared by the channel and the drain. Absent a gradual LDD profile, an abrupt junction can exist where almost all of the voltage drop occurs across the lightly-doped channel. The smoother the LDD profile, the smaller will be Em.

Forming the gradual LDD profile simply involves a sequence of selectively formed masking materials placed upon the gate dielectric, wherein etching begins at the sidewall surface and incrementally increases toward the mid-line between opposing sidewall surfaces according to that which has been exposed immediately proceeding each etch. Thus, the present gate structure includes an upper surface with at least one vertical step, or riser, which extends along the elongated axis of the conductor. If a gradually increasing LDD profile is desired, then multiple steps may used.

It will be appreciated to those skilled in the art having the benefit of this disclosure that this invention is believed to be capable of forming a p-channel transistor, an n-channel transistor, or both upon a single monolithic substrate which derives a benefit in having an asymmetrical LDD structure. Furthermore, it also to be understood that the form of the invention shown and described is to be taken as exemplary, presently preferred embodiments. Various modifications and changes may be made without departing from the spirit and scope of the invention as set forth in the claims. It is intended that following claims be interpreted to embrace all such modifications and changes and, accordingly, the specification drawings are regarded in an illustrative rather than in a restrictive sense.

What is claimed is:

1. A method for forming a transistor, comprising:

forming a gate dielectric upon a semiconductor substrate;

patterning a gate conductor extending upon the gate dielectric along an axis, wherein the gate conductor comprises a pair of sidewall surfaces spaced an equal distance from and parallel to said axis;

removing an upper portion of the gate conductor laterally bounded by said axis and one of said pair of sidewall surfaces to form a partially retained area of the gate conductor extending along the axis adjacent a fully retained area of the gate conductor, wherein a thickness of the gate conductor adjacent to the one of said pair of sidewall surfaces is less than a thickness of the gate conductor adjacent to the other of said pair of sidewall surfaces; and forwarding a plurality of ionized atoms toward the gate conductor at an energy level which allows a portion of said plurality of atoms to extend through the partially retained areas of the gate conductor and form a lightly doped drain (LDD) region within the substrate directly beneath the partially retained area.

2. The method as recited in claim 1, wherein said removing comprises:

depositing a masking material across the gate conductor; and selectively removing the masking material to expose an upper surface of the gate conductor in a region laterally bounded by said axis and one of said pair of sidewall surfaces; and etching the exposed said upper surface to an elevation level below the upper surface.

3. The method as recited in claim 2, wherein said elevation level is at a midpoint between the upper surface and the gate dielectric.

4. The method as recited in claim 2, wherein said elevation level is below a midpoint between the upper surface and the gate dielectric.

5. The method as recited in claim 1, wherein said forwarding comprises implanting at an energy between 10 keV to 200 keV said plurality of atoms through the partially retained area which has a thickness between 200 to 1000 angstroms.

6. The method as recited in claim 1, wherein said forwarding comprises masking with said fully retained area said plurality of ionized atoms from entering said substrate directly below the fully retained area.

7. A method for forming a gate conductor, comprising:

depositing a layer of polycrystalline silicon material across a dielectric-covered single crystalline silicon;

patterning from the layer of polycrystalline silicon material a gate conductor which partially extends along a elongated axis between a pair of opposed sidewall surfaces; and removing a partial thickness of said gate conductor along said axis from one of the pair of sidewall surfaces partially toward the other of said pair of sidewall surfaces, wherein a remaining thickness of said gate conductor adjacent to the one of the pair of sidewall surfaces is less than a thickness of the gate conductor adjacent to the other of the pair of sidewall surfaces.

8. The method as recited in claim 7, wherein said removing comprises forming a gate conductor of dissimilar thickness.

9. The method as recited in claim 7, wherein said removing comprises forming a gate conductor having at least two thicknesses, both of which extend along said axis.

10. The method as recited in claim 7, wherein said removing comprises forming a gate conductor having at least two thicknesses, each of which extend along said axis.

11. The method as recited in claim 7, wherein said removing comprises etching an exposed portion of said gate conductor.

12. The method as recited in claim 7, further comprising forwarding ions toward the gate conductor and through only the portion of the gate conductor which is partially removed of thickness.

* * * * *